(12) United States Patent
Hao et al.

(10) Patent No.: US 6,475,868 B1
(45) Date of Patent: Nov. 5, 2002

(54) OXYGEN IMPLANTATION FOR REDUCTION OF JUNCTION CAPACITANCE IN MOS TRANSISTORS

(75) Inventors: Ming Yin Hao, Sunnyvale, CA (US); Asim Selcuk, Cupertino, CA (US); Richard P. Rouse, San Francisco, CA (US); Emi Ishida, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/640,082

(22) Filed: Aug. 17, 2000

Related U.S. Application Data
(60) Provisional application No. 60/149,487, filed on Aug. 18, 1999.

(51) Int. Cl.[7] ............................................. H01L 21/00
(52) U.S. Cl. ...................................... 438/301; 438/528
(58) Field of Search ................................. 438/305, 528, 438/303

(56) References Cited

U.S. PATENT DOCUMENTS 4,523,213 A * 6/1985 Konaka et al.
4,683,637 A * 8/1987 Varker et al.
4,689,667 A * 8/1987 Aronowitz et al.
4,700,454 A * 10/1987 Baerg et al.
5,514,902 A    5/1996 Kawasaki et al.
5,567,629 A * 10/1996 Kubo
5,712,173 A * 1/1998 Liu et al.
6,069,054 A * 5/2000 Choi ........................... 438/423
6,153,486 A * 11/2000 Ibok ........................... 438/306

FOREIGN PATENT DOCUMENTS

JP          2-91973    * 3/1990

* cited by examiner

Primary Examiner—Richard Booth

(57) ABSTRACT

Silicon-based, submicron-dimensioned MOS and/or CMOS transistor devices having substantially reduced source/drain junction-to-semiconductor substrate capacitance are formed by implanting oxygen atoms and/or molecules just below source/drain implant regions. Implantation conditions are selected to provide a peak oxygen implant concentration at a depth just below the ultimate source/drain junction depth. Subsequent thermal processing at elevated temperature results in source/drain dopant diffusion/activation and formation of a silicon oxide barrier layer or stratum just below the ultimate source/drain junction depth, thereby substantially reducing junction-to-substrate capacitance of refractory metal silicide-contact devices.

14 Claims, 2 Drawing Sheets

OXYGEN IMPLANTATION FOR REDUCTION OF JUNCTION CAPACITANCE IN MOS TRANSISTORS

This application claims priority from Provisional Application Ser. No. 60/149,487 filed on Aug. 18, 1999 entitled: "OXYGEN IMPLANTATION FOR REDUCTION OF JUNCTION CAPACITANCE IN MOS TRANSISTORS", the entire disclosure of which is hereby incorporated by reference therein.

FIELD OF THE INVENTION

The present invention relates to a method of manufacturing semiconductor devices, e.g., MOS-type transistors and integrated circuits comprising such devices, with improved processing methodology resulting in increased quality, e.g., lower junction-to-substrate capacitance, and MOS-type devices obtained thereby. The present invention is also useful in the manufacture of CMOS semiconductor devices and has particular applicability in fabricating high-density integration semiconductor devices with design features below about 0.18 um, e.g., about 0.15 um and below.

BACKGROUND OF THE INVENTION

The escalating requirements for high density and performance associated with ultra large-scale integration (ULSI) semiconductor devices require design features of 0.18 um and below, such as 0.15 um and below, increased transistor and circuit speeds, high reliability and quality, and increased manufacturing throughput for economic competitiveness. The reduction of design features to 0.18 um and below challenges the limitations of conventional semiconductor manufacturing techniques.

As feature sizes of MOS and CMOS devices are reduced into the sub-micron range, so-called "short channel" effects arise which tend to limit device performance. For n-channel transistors, the major limitation encountered is caused by hot-electron-induced instabilities. This problem is attributed to high electrical fields between the source and the drain, particularly near the drain, such that charge carriers, either electrons or holes, are injected into the gate or semiconductor substrate. Injection of hot carriers into the gate can cause gate oxide charging and threshold voltage instabilities which accumulate over time and greatly degrade device performance. In order to counter and thus reduce such instabilities, lightly-doped source/drain extension structures have been developed.

For p-channel transistors of short-channel type, the major limitation on performance arises from "punch-through" effects which occur with relatively deep junctions. In such instances, there is a wider sub-surface depletion effect and it is easier for the field lines to go from the drain to the source, resulting in the above-mentioned "punch through" current problems and device shorting. To minimize this effect, relatively shallow junctions are employed in forming p-channel MOS transistors.

The most satisfactory solution to date of hot carrier instability problems of MOS devices is the provision of lightly- or moderately-doped source/drain extensions driven just under the gate region, while the heavily-doped drain region is laterally displaced away from the gate by the use of a sidewall spacer on the gate. Such structures are particularly advantageous because they do not have problems with large lateral diffusion and the channel length can be set precisely.

A further problem or drawback encountered with the manufacture of such submicron-dimensioned MOS-type transistor devices, which problem is not addressed or ameliorated by the above-described formation of lightly- or moderately-doped source/drain extensions, arises from source/drain junction-to-substrate capacitance effects. More specifically, high source/drain junction-to-substrate capacitance adversely affects, i.e., degrades, transistor performance characteristics. However, the parallel trends towards increased microminiaturization and large scale integration require MOS and MOS-type transistor devices with reduced source/drain junction-to-substrate capacitance, for meeting overall device performance requirements.

Thus, a need exists for improved semiconductor manufacturing methodology for fabricating MOS and CMOS transistors, which methodology substantially reduces or eliminates the deleterious effects on device performance attributed to high source/drain-to-junction capacitance effects. Moreover, there exists a need for an improved process for fabricating MOS transistor-based devices which is fully compatible with conventional process flow and requirements for manufacturing throughput and product yield.

DISCLOSURE OF THE INVENTION

An advantage of the present invention is an improved method for forming semiconductor junctions with substantially reduced junction-to-semiconductor substrate capacitance.

Another advantage of the present invention is an improved method for manufacturing MOS and/or CMOS transistor devices with substantially reduced source/drain junction-to-substrate capacitance.

Yet another advantage of the present invention is an improved silicon-based MOS-type transistor device having substantially reduced source/drain junction-to-substrate capacitance.

Additional advantages and other features of the present invention will be set forth in the description which follows and in part will become apparent to those having ordinary skill in the art upon examination of the following or may be learned from the practice of the instant invention. The advantages of the present invention may be realized and obtained as particularly pointed out in the appended claims.

According to an aspect of the present invention, the foregoing and other advantages are achieved in part by a method of manufacturing a semiconductor device having reduced junction-to-substrate capacitance, which method comprises the sequential steps of:

(a) providing a device precursor structure comprising a semiconductor substrate of a first conductivity type having a surface;

(b) selectively introducing dopant impurities of a second conductivity type opposite the first conductivity type into at least one portion of said substrate, for forming at least one semiconductor junction at a preselected ultimate depth below the substrate surface;

(c) selectively introducing oxygen atoms and/or molecules into the at least one portion of the substrate, such that a peak concentration of the oxygen atoms and/or molecules occurs just below the ultimate depth of the at least one semiconductor junction; and (d) thermally treating the oxygen-introduced substrate at a temperature and for an interval sufficient to effect reaction between the semiconductor substrate and the introduced oxygen atoms and/or molecules, thereby forming an oxide barrier in the substrate just below the ultimate depth of the at least one semiconductor junction, thereby reducing junction-to-substrate capacitance.

In embodiments according to the present invention, step (a) comprises providing a silicon wafer substrate and step (d) comprises rapid thermal annealing (RTA) at a temperature of from about 1,000–1,050° C. for about 10–15 seconds.

In further embodiments according to the present invention, step (a) comprises providing a device precursor structure comprising a layer stack formed on a portion of the substrate surface, the layer stack comprising:

i. a thin gate insulating layer in contact with the substrate surface; and ii. a gate electrode layer formed on the gate insulating layer, the layer stack comprising a pair of opposing side surfaces and a top surface, with a sidewall spacer of an insulative material formed on each of the opposing side surfaces; and step (b) comprises introducing the dopant impurities of second conductivity type, opposite the first conductivity type, into portions of the substrate adjacent each of the sidewall spacers, thereby forming source/drain regions in the substrate; the device precursor structure comprises a silicon wafer substrate, the thin gate insulating layer comprises a silicon oxide layer about 25–50 Angstroms thick, the gate electrode layer comprises heavily-doped polysilicon, the sidewall spacers each comprise an oxide, nitride, or oxynitride of silicon; and the method further comprises step (e) of forming, as by a salicide process, ohmic-electrical contacts to the top surface of the gate electrode layer and to each of the source/drain regions.

In yet further embodiments according to the invention, step (b) comprises implanting the second, opposite conductivity type dopant impurities at a preselected dosage and energy for providing the at least one semiconductor junction at the preselected depth below the substrate surface; step (c) comprises implanting the oxygen atoms and/or molecules at a preselected dosage and energy for providing the peak concentration of oxygen atoms and/or molecules just below the ultimate depth (i.e., after thermal annealing) of the at least one semiconductor junction; and the method comprises the further step (e) of forming an ohmic electrical contact to the at least one semiconductor junction.

According to another aspect of the present invention, a method of manufacturing a silicon-based MOS-type transistor device having reduced source/drain junction-to-semiconductor substrate capacitance comprises the sequential steps of:

(a) providing a MOS transistor precursor structure comprising a silicon wafer substrate of a first conductivity type and a layer stack formed on a portion of the surface of the wafer substrate, the layer stack comprising:

i. a thin gate insulating layer comprising a silicon oxide layer about 25–50 Angstroms thick in contact with the wafer surface; and ii. a gate electrode layer comprising heavily-doped polysilicon formed on the gate insulating layer, the layer stack comprising a pair of opposing side surfaces and a top surface, with an insulative sidewall spacer comprising an oxide, nitride, or oxynitride of silicon formed on each of the opposing side surfaces of the layer stack, (b) selectively implanting dopant impurities of second, opposite conductivity type into portions of the substrate adjacent the sidewall spacers for forming spaced-apart source/drain junction regions in the substrate, the dosage and energy of the implanted dopant impurities being selected for providing source/drain junctions at a preselected depth below the wafer substrate surface;

(c) selectively implanting oxygen atoms and/or molecules into the wafer substrate portions adjacent the sidewall spacers, the implanted oxygen atoms and/or molecules having a dosage and energy selected for providing a peak concentration of implanted oxygen atoms and/or molecules just below the ultimate depth of the source/drain junctions;

(d) thermally treating the oxygen-implanted substrate at a temperature of about 1,000–1,050° C. for about 10–15 seconds for effecting reaction between the silicon wafer substrate and the implanted oxygen atoms and/or molecules, thereby forming a silicon oxide barrier in the substrate just below each of the source/drain junctions; and (e) forming electrically conductive refractory metal silicide ohmic metal contacts to the top surface of the gate electrode layer and to the source/drain junction regions by a salicide process.

In embodiments according to the present invention, step (a) comprises providing an n-type silicon wafer substrate; step (b) comprises implanting boron-containing p-type dopant impurities at preselected dosages and energies for forming source and drain junctions at a desired ultimate depth below the wafer substrate surface; and step (c) comprises implanting oxygen atoms and/or molecules at preselected dosages and energies for providing a peak concentration of implanted oxygen atoms and/or molecules at a preselected depth below the substrate surface.

In other embodiments according to the present invention, step (a) comprises providing a p-type silicon wafer substrate; step (b) comprises implanting phosphorus- or arsenic-containing n-type impurities at preselected dosages and energies for forming source and drain junctions at a desired ultimate depth below the wafer substrate surface; and step (c) comprises implanting oxygen atoms and/or molecules at preselected dosages and energies for providing the peak concentration of implanted oxygen atoms and/or molecules at a preselected depth below the substrate surface.

In further embodiments of the present invention, step (e) comprises forming an electrically conductive metal silicide of a refractory metal selected from the group consisting of titanium, nickel, and cobalt.

According to still another aspect of the present invention, a silicon-based MOS transistor having reduced source/drain junction-to-substrate capacitance comprises:

a silicon semiconductor wafer substrate of a first conductivity type and having a surface;

a layer stack formed on a portion of the wafer surface, the layer stack comprising:

i. a thin gate insulating layer comprising a silicon oxide layer about 25–50 Angstroms thick in contact with the portion of the wafer surface; and ii. a gate electrode layer comprising heavily-doped polysilicon formed on the gate insulating layer, the layer stack comprising a pair of opposing side surfaces and a top surface, with an insulative sidewall spacer comprising an oxide, nitride, or oxynitride of silicon formed on each of the opposing side surfaces;

source/drain junction regions of preselected depth below the wafer surface formed in portions of the wafer substrate adjacent the sidewall spacers;

a silicon oxide barrier layer selectively formed within the wafer substrate just below each of the source and drain junction regions for reducing source/drain junction-to-substrate capacitance; and electrically conductive refractory metal silicide ohmic contacts formed on the top surface of the gate electrode and on each of the source and drain junction regions.

In embodiments according to the present invention, the silicon wafer substrate is n-type and the source/drain junction regions are p-type; whereas, in other embodiments according to the present invention, the silicon wafer substrate is p-type and the source/drain junction regions are n-type.

In further embodiments according to the present invention, the electrically conductive metal silicide of the ohmic contacts comprises a refractory metal selected from the group consisting of titanium, nickel, and cobalt; and the MOS device has a substantially reduced source/drain junction-to-substrate capacitance.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

DESCRIPTION OF THE INVENTION

Figure 1:
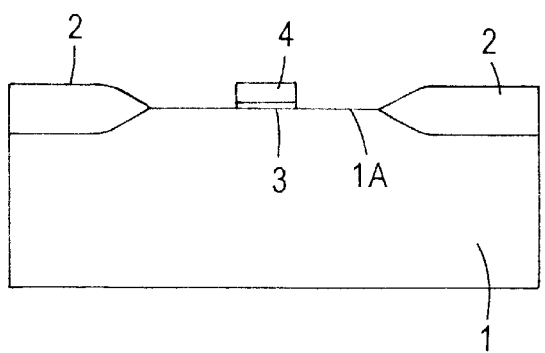
FIGS. 1–8 illustrate, in simplified, cross-sectional form, a sequence of processing steps for forming an MOS-type transistor according to an embodiment of the present invention, wherein like reference numerals are employed throughout for designating like features and/or components of the invention.

The present invention addresses and solves problems arising from junction-to-semiconductor substrate capacitance effects, particularly in manufacturing submicron-dimensioned MOS and CMOS transistors and devices for high-density integration applications. More specifically, the present invention advantageously enables a significant and substantial reduction in source/drain junction-to-substrate capacitance of silicon-based MOS- and CMOS-type transistors, by selectively providing a silicon oxide barrier layer just beneath the source/drain junctions with the silicon substrate. Advantageously, the inventive method is fully compatible with all other aspects of existing processing methodology for the manufacture of such devices.

Briefly stated, according to the present invention, a method of manufacturing MOS and CMOS transistors, as well as other devices comprising at least one semiconductor junction, is provided, wherein several (typically two) additional processing steps are performed immediately subsequent to introduction of dopant impurities into a semiconductor substrate, as by ion implantation, for junction formation therein at a preselected depth below a surface of the substrate. The additional processing comprises a first step of selectively implanting oxygen atoms and/or molecules into the dopant implanted portions of the substrate, the implantation being performed at a preselected dosage and energy for providing a peak concentration of implanted oxygen atoms and/or molecules at a depth just below the ultimate depth of the at least one semiconductor junction, typically source/drain junctions of a MOS or CMOS transistor device. In a second additional processing step, the oxygen-implanted semiconductor substrate, typically a monocrystalline silicon wafer, is thermally treated at a temperature and for an interval sufficient to effect reaction between the semiconductor substrate and the implanted oxygen atoms and/or molecules to form an oxide barrier layer within the substrate just below the at least one semiconductor junction, thereby providing a significant and substantial reduction in junction-to-substrate capacitance.

Referring now to FIGS. 1–8, shown therein is a sequence of steps for performing an illustrative, but not limitative, MOS-based embodiment of the present invention, wherein similar reference numerals are used throughout to denote similar features. As will be apparent, the inventive process may be readily adapted for use in manufacturing p-n junction devices, such as diodes, CMOS transistors, and similar devices. It should also be recognized that the process steps and structures described below do not necessarily form a complete process flow for manufacturing MOS or CMOS transistors for use in integrated circuits. However, the present invention can be practiced in conjunction with conventional integrated circuit fabrication techniques and methodologies currently employed in the art, and only so much of the commonly practiced process steps are included here as are necessary for an understanding of the present invention. As used throughout the present disclosure and claims, the term "substrate" denotes a semiconductor substrate per se or an epitaxial semiconductor layer formed on a suitable semiconductor substrate. Finally, the figures representing cross-sections of portions of an integrated circuit device during fabrication processing are not drawn to scale, but instead are drawn as to best illustrate the features of the present invention.

FIGS. 1–5 illustrate a sequence of processing steps for forming an MOS device precursor structure suitable for use in practicing an example of the inventive methodology. As shown in FIG. 1, device insulation regions 2, typically of a silicon oxide, are formed at predetermined portions of a major surface 1A of a semiconductor substrate 1 of a first conductivity type, typically a monocrystalline silicon (Si) wafer, as by use of local oxidation of silicon (LOCOS) or shallow trench isolation (STI) processing techniques. A thin silicon oxide insulator film about 25–50 Angstroms thick, and an undoped polycrystalline Si film about 2,000 Angstroms thick, are then successively formed over surface 1A and patterned, thereby forming a layer stack comprising a thin gate insulator film 3 and an overlying gate electrode 4 on a portion of semicoductor surface 1A.

Figure 2:
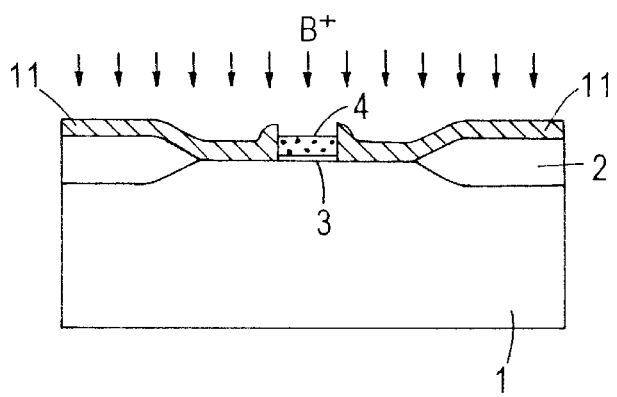
Figure 3:
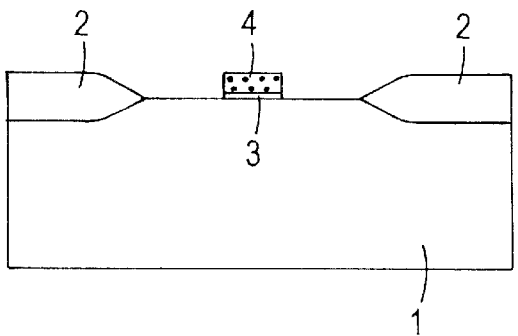

Next, as shown in FIG. 2, a resist layer 11 is formed, as by photolithographic masking and etching techniques, to cover the substrate surface 1A except for the top surface of the gate electrode 4. Then, using resist layer 11 as an implantation mask, boron (B)-containing ions are implanted in the gate electrode 4, in conventional manner, followed by removal of resist layer 11. As shown in FIG. 3, heat treatment at an elevated temperature, typically in the range of about 800–900° C., is then performed for diffusing and activating the implanted boron dopant impurities in gate electrode 4.

Figure 4:
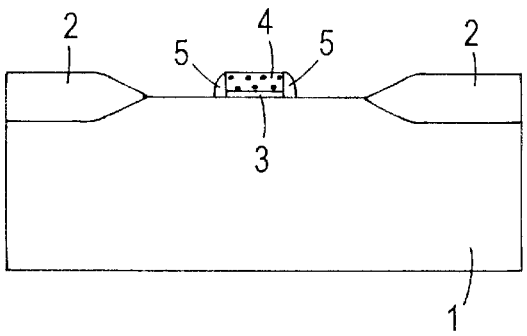

Adverting to FIG. 4, insulative sidewall spacers 5 of predetermined thickness profile and comprising an insulative material selected from an oxide, nitride, or oxynitride of silicon are then formed on opposing side surfaces of the gate insulator/gate electrode layer stack 3,4 by anisotropically etching, in conventional manner, a blanket layer of the selected insulative material initially formed so as to cover the entire surface 1A of substrate 1.

Figure 5:
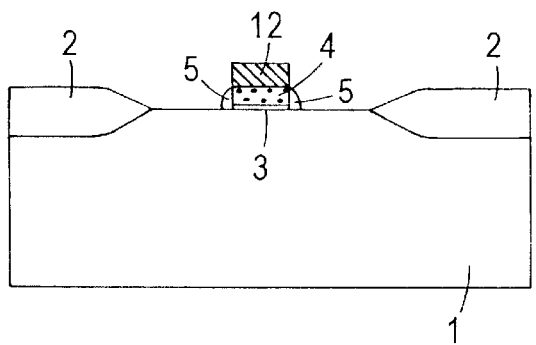
Figure 6:
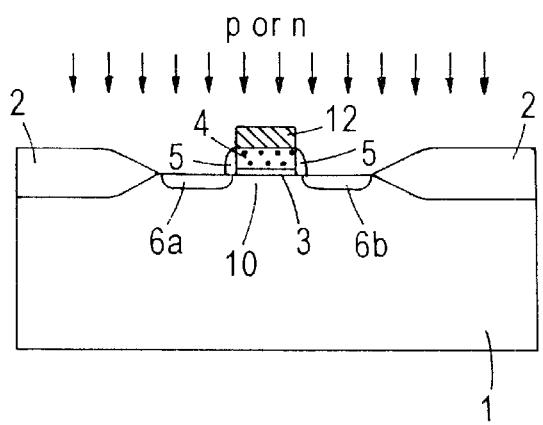

Next, as shown in FIG. 5, a resist layer 12 is selectively formed on the top surface of gate electrode 4 by photolithographic techniques and, as illustrated in FIG. 6, p or n dopant impurities of a second conductivity type opposite that of the substrate 1 are implanted into the portions of the substrate surface 1A adjacent to and on opposite sides of the gate insulator/gate electrode layer stack 3,4 with patterned resist layer 12, sidewall spacers 5, and device isolation regions 2 acting as implantation masks, to form source and drain implants 6a and 6b, with channel region 10 therebetween. The ion implantation conditions are selected to provide, after annealing for dopant diffusion and activation, source and drain regions having a preselected dopant density and ultimate junction depth below substrate surface 1A. By way of illustration, but not limitation, for forming PMOS transistors in n-type Si wafer substrates, boron-containing ions may be implanted at preselected dosages and energies for forming source and drain junctions at desired ultimate depths below substrate surface 1A; whereas, for forming NMOS transistors in p-type Si wafer substrates, phosphorus- or arsenic-containing ions may be implanted at preselected dosages and energies for forming source and drain junctions at desired ultimate depths below substrate surface 1A. In either instance, given the present disclosure and objectives of the invention, the artisan can readily determine and/or select useful and/or optimal implantation conditions for a particular device application.

Figure 7:
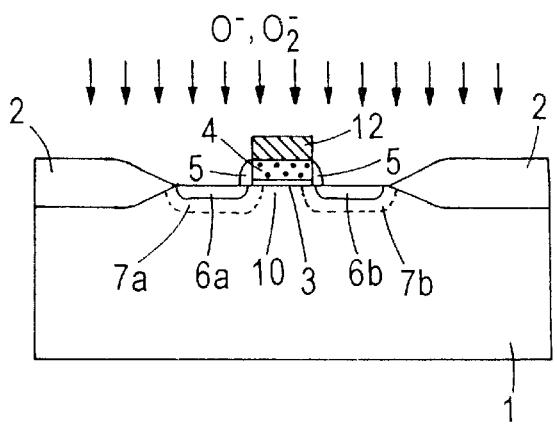

Referring now to FIG. 7, according to the inventive methodology, oxygen atoms and/or molecules are then implanted into the portions of the substrate surface 1A adjacent to and on opposite sides of the gate insulator/gate electrode layer stack 3, 4 (i.e., the source/drain implant regions 6a, 6b), again utilizing the patterned resist layer 12, sidewall spacers 5, and device isolation regions 2 as implantation masks, for forming oxygen-implanted regions 7a, 7b wherein the peak oxygen concentration thereof is just below the ultimate depth of the p- or n-type source/drain implants 6a, 6b after thermal annealing for dopant diffusion and activation. By way of illustration, but not limitation, for PMOS transistors comprising boron-implanted p-type source/drain regions in n-type monocrystalline Si substrates, oxygen atoms and/or molecules may be implanted at preselected dosages and energies for providing peak concentrations of implanted oxygen atoms and/or molecules at preselected depths below substrate surface 1A; whereas, for NMOS transistors comprising phosphorus- or arsenic-implanted n-type source/drain regions in p-type monocrystalline Si substrates, oxygen atoms and/or molecules may be implanted at preselected dosages and energies for providing peak concentrations of implanted oxygen atoms at desired depths below the substrate surface 1A. As before, given the present disclosure and objectives of the invention, implantation conditions can be readily determined and/or selected for use in a particular application.

Figure 8:
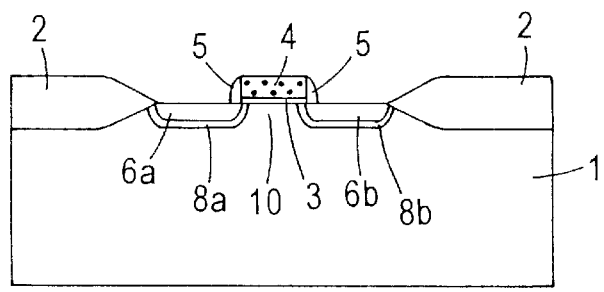

In the next step according to the inventive method, the oxygen-implanted substrate 1 is then subjected to thermal processing, as by rapid thermal annealing (RTA) or furnace annealing for effecting diffusion and activation of implanted p- or n-type dopant impurities in source/drain implant regions 6a, 6b and reaction of implanted oxygen atoms and/or molecules, particularly at the peak concentration thereof, with the semiconductor substrate 1, illustratively Si, to form a silicon oxide barrier region, stratum, or layer at a preselected depth below substrate surface 1A. The resulting structure is illustrated in FIG. 8 (after removal of patterned photoresist layer segment 12), wherein p- or n-type source/drain implant regions 6a, 6b are shown as having increased in extent in both lateral and depth dimensions, and oxide barrier regions 8a, 8b are located just below the respective junctions formed between source/drain regions 6a, 6b and substrate 1. By way of illustration, but not limitation, for monocrystalline Si wafer substrates, thermal treatment for simultaneously effecting source/drain dopant diffusion/activation and oxide barrier formation may be performed by RTA at a temperature of about 1,000–1,050° C. for about 10–15 seconds.

In subsequent processing steps (not shown), electrically conductive ohmic contacts of a refractory metal silicide, typically selected from titanium, nickel, and cobalt silicides, are formed on the top surface of gate electrode 4 and on source/drain regions 6a, 6b, as by conventional salicide processing techniques not described here for brevity. Silicon-based, refractory metal silicide-contacted MOS transistor devices of the type illustrated herein and formed according to the inventive methodology typically exhibit significantly and substantially reduced source/drain junction-to-substrate capacitances vis-a-vis comparable devices fabricated according to conventional processing practices.

The present invention thus enables formation of reliable, submicron-dimensioned MOS and/or CMOS transistor devices with reduced source/drain junction-to-substrate capacitance at manufacturing rates consistent with throughput requirements for economic competitiveness, and is fully compatible with conventional process flow for automated manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. A method of manufacturing a semiconductor device having reduced junction-to-semiconductor substrate capacitance, which method comprises the sequential steps of:
   (a) providing a device precursor structure comprising a semiconductor substrate of a first conductivity type having a surface;
   (b) selectively introducing dopant impurities of a second conductivity type, opposite the first conductivity type, into at least one portion of said substrate, for forming at least one semiconductor junction at a preselected ultimate depth below said substrate surface;
   (c) selectively introducing oxygen atoms and/or molecules into said at least one portion of said substrate, such that a peak concentration of said oxygen atoms and/or molecules occurs just below the ultimate depth of said at least one semiconductor junction; and (d) thermally treating the oxygen-introduced substrate at a temperature and for an interval sufficient to effect reaction between said semiconductor substrate and said introduced oxygen atoms and/or molecules, thereby forming an oxide barrier within said substrate, completely surrounding and separating the implanted impurities from the substrate just below the ultimate depth of said least one semiconductor junction, thereby reducing junction-to-substrate capacitance.

2. The method as in claim 1, wherein step (a) comprises providing a silicon wafer substrate.

3. The method as in claim 2, wherein step (d) comprises rapid thermal annealing at a temperature of about 1,000–1,050° C. for about 10–15 seconds.

4. The method as in claim 1, wherein:
step (a) comprises providing a device precursor structure comprising a layer stack formed on a portion of said substrate surface, said layer stack comprising:
  i. a thin gate insulating layer in contact with said substrate surface; and
  ii. a gate electrode layer formed on said gate insulating layer, said layer stack comprising a pair of opposing side surfaces and a top surface, with a sidewall spacer of an insulative material formed on each of said opposing side surfaces; and
step (b) comprises introducing said second, opposite conductivity type dopant impurities into portions of said substrate adjacent each of said sidewall spacers, thereby forming source and drain regions in said substrate.

5. The method as in claim 4, wherein said device precursor structure comprises a silicon wafer substrate, said thin gate insulating layer comprises a silicon oxide layer about 25–50 Angstroms thick, said gate electrode layer comprises heavily-doped polysilicon, and said sidewall spacers each comprise an oxide, nitride, or oxynitride of silicon.

6. The method as in claim 1, wherein step (b) comprises implanting said second, opposite conductivity type dopant impurities at a preselected dosage and energy for providing said at least one semiconductor junction at said preselected ultimate depth below said substrate surface.

7. The method as in claim 1, wherein step (c) comprises implanting said oxygen atoms and/or molecules at a preselected dosage and energy for providing said peak concentration of oxygen atoms and/or molecules just below the ultimate depth of said at least one semiconductor junction.

8. The method as in claim 1, further comprising the step of:
(e) forming an ohmic electrical contact to the at least one semiconductor junction.

9. The method as in claim 4, further comprising the step of:
(e) forming ohmic electrical contacts to said top surface of said gate electrode layer and to each of said source and drain regions.

10. The method as in claim 9, wherein step (e) comprises said forming ohmic contacts by a salicide process.

11. A method of manufacturing a silicon-based MOS-type transistor device having reduced source/drain junction-to-semiconductor substrate capacitance, which method comprises the sequential steps of:
(a) providing a MOS transistor precursor structure comprising a silicon semiconductor wafer substrate of a first conductivity type and a layer stack formed on a portion of a surface of said wafer substrate, said layer stack comprising:
  i. a thin gate insulating layer comprising a silicon oxide layer about 25–50 Angstroms thick in contact with said wafer surface; and
  ii. a gate electrode layer comprising heavily-doped polysilicon formed on said gate insulating layer, said layer stack comprising a pair of opposing side surfaces and a top surface, with an insulate sidewall spacer comprising an oxide, nitride, or oxynitride of silicon formed on each of said opposing side surfaces;
(b) selectively implanting dopant impurities of second conductivity type, opposite the first conductivity type, into portions of said substrate adjacent said sidewall spacers for forming spaced-apart source/drain regions in said substrate, the dosage and energy of the implanted dopant impurities being selected for providing source/drain junctions at a preselected ultimate depth below said substrate surface;
(c) selectively implanting oxygen atoms and/or molecules into said substrate portions adjacent said sidewall spacers, the implanted oxygen atoms and/or molecules having a dosage and energy selected for providing a peak concentration of implanted oxygen atoms and/or molecules just below the ultimate depth of said source/drain junctions;
(d) thermally treating the oxygen-implanted substrate at a temperature of about 1,000–1,050° C. for about 10–15 seconds for effecting reaction between said silicon substrate and the implanted oxygen atoms and/or molecules, thereby forming a silicon oxide barrier in said substrate completely surrounding and separating the implanted impurities from the substrate just below the ultimate depth of each of said source/drain junctions; and
(e) forming electrically conductive refractory metal silicide ohmic contacts to said top surface of said gate electrode layer and to said source/drain junction regions by a silicide process.

12. The method as in claim 11, wherein step (a) comprises providing an n-type silicon wafer substrate; step (b) comprises implanting boron-containing p-type dopant impurities at preselected dosages and energies for forming source/drain junctions at a desired ultimate depth below said substrate surface; and step (c) comprises implanting oxygen atoms and/or molecules at preselected dosages and energies for providing said peak concentration of implanted oxygen atoms and/or molecules at a preselected depth below said substrate surface.

13. The method as in claim 11, wherein step (a) comprises providing a p-type silicon wafer substrate; step (b) comprises implanting phosphorus- or arsenic-containing n-type impurities at preselected dosages and energies for forming source/drain junctions at a desired ultimate depth below said substrate surface; and step (c) comprises implanting oxygen atoms and/or molecules at preselected dosages and energies for providing said peak concentration of implanted oxygen atoms and/or molecules at a preselected depth below said substrate surface.

14. The method according to claim 11, wherein step (e) comprises forming an electrically conductive refractory metal silicide of a metal selected from the group consisting of titanium, nickel, and cobalt.

* * * * *